United States Patent [19]

Hetyei

[11] Patent Number: 4,694,200
[45] Date of Patent: Sep. 15, 1987

[54] DEVICE FOR DETECTING A PULSE TRAIN IN NOISE AND APPLICATION TO A RADIONAVIGATION AID SYSTEM OF DME TYPE

[75] Inventor: Joseph Hetyei, Bouffemont, France
[73] Assignee: Thomson-CSF, Paris, France
[21] Appl. No.: 833,734
[22] Filed: Feb. 25, 1986

[30] Foreign Application Priority Data

Mar. 5, 1985 [FR] France ................................ 85 03228

[51] Int. Cl.⁴ ............................................ H03K 5/153
[52] U.S. Cl. ................................... 307/358; 307/351; 307/518; 307/234; 328/117
[58] Field of Search ............... 307/351, 358, 518, 520, 307/234, 350; 328/110, 117

[56] References Cited

U.S. PATENT DOCUMENTS

| 3,532,905 | 10/1970 | Zijta et al. | 307/358 |
| 3,668,532 | 6/1972 | Potash | 328/147 |
| 3,676,783 | 7/1972 | Kinbara et al. | 307/358 |
| 4,431,916 | 2/1984 | Couch | 307/358 |
| 4,507,795 | 3/1985 | Wagner | 307/358 |

FOREIGN PATENT DOCUMENTS 0058095 8/1982 European Pat. Off. .

OTHER PUBLICATIONS

Instruments & Experimental Techniques, vol. 25, No. 4, Jul.-Aug. (1982), A. A. Aleksandrov et al., "Pulse Shaper for Time Clamping to the Rising Edge of Pulses in Semiconductor Detectors".
Electronics, vol. 40, No. 9, May 1967, pp. 69-70, E. B. Dalkiewicz et al., "Intersecting Waveforms Trigger Peak Detector".
IBM Technical Disclosure Bulletin, vol. 13, No. 8, Jan. 1971, R. Frankeny: "Peak Detection".

Primary Examiner—John Zazworsky
Attorney, Agent, or Firm—Roland Plottel

[57] ABSTRACT

A device for detecting, among noise, each of the pulses of a pulse train, comprising essentially: a detector detecting the peak of a pulse; a first delay line; a first comparator comparing the level of the first delayed pulse with the half peak value; a second delay line for delaying the pulse train with a second delay different from the first one; a second comparator comparing the signal delivered by a second delay line with the signal delivered by the first delay line and with the half peak value, and an AND gate delivering an output signal when there is coincidence of the output signals from said two comparators.

9 Claims, 11 Drawing Figures

FIG_1
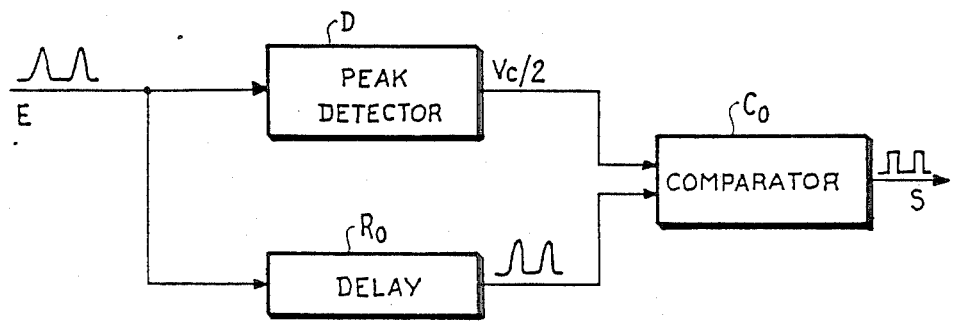
*PRIOR ART*
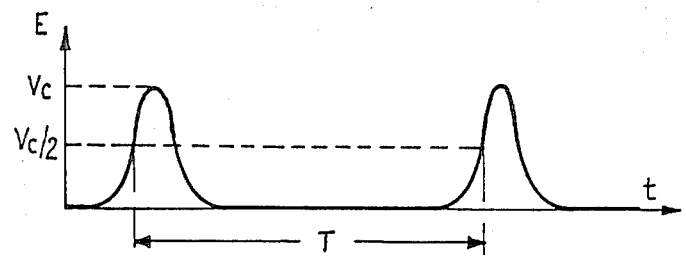
FIG_2-a
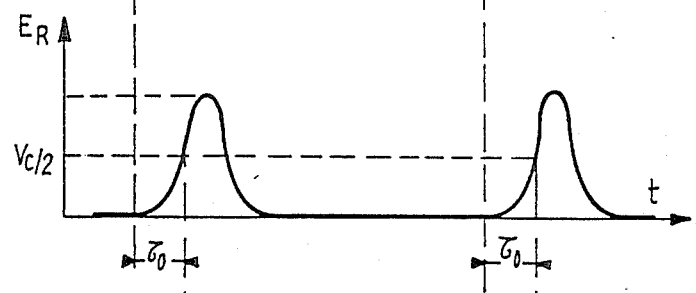
FIG_2-b
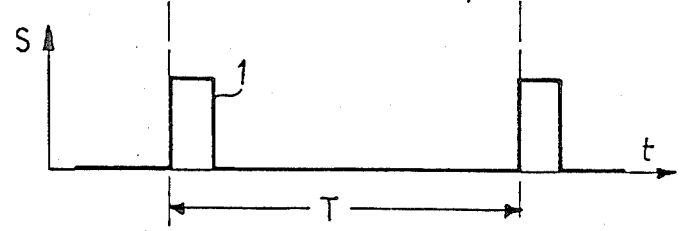
FIG_2-c

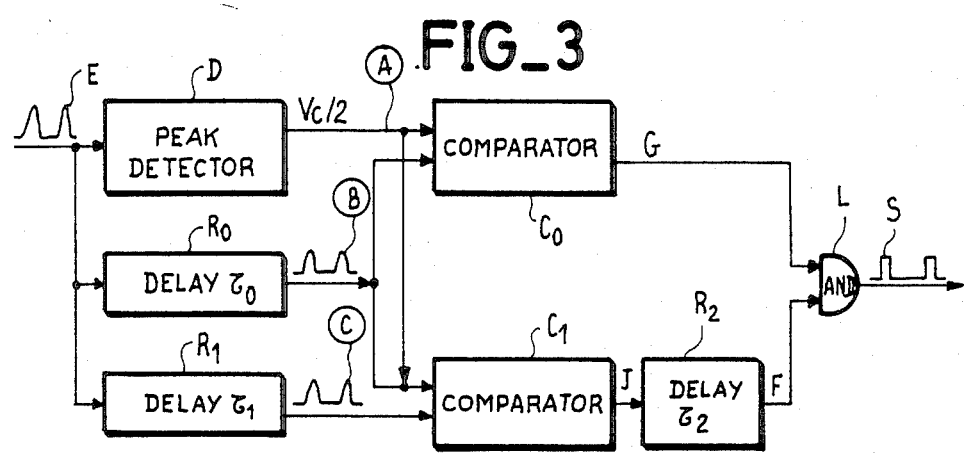
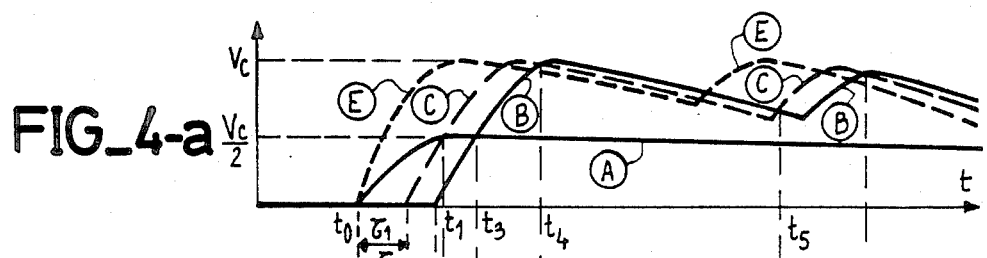
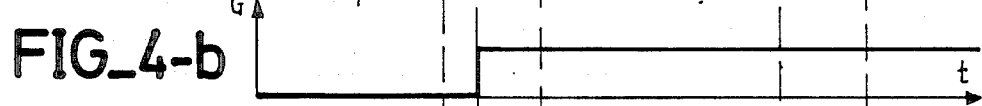
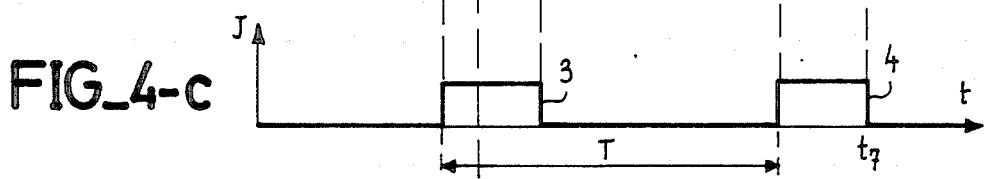
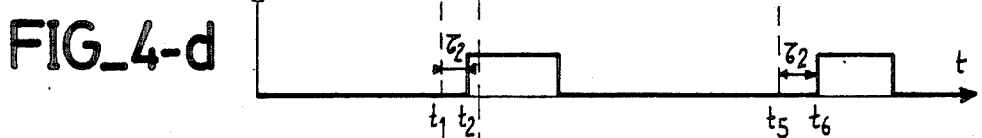
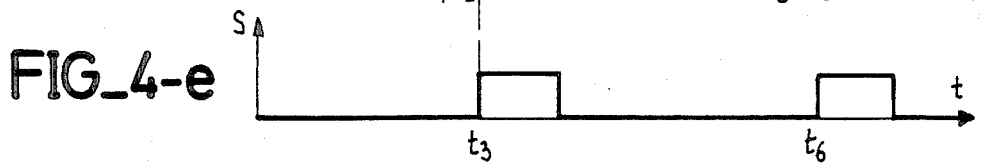

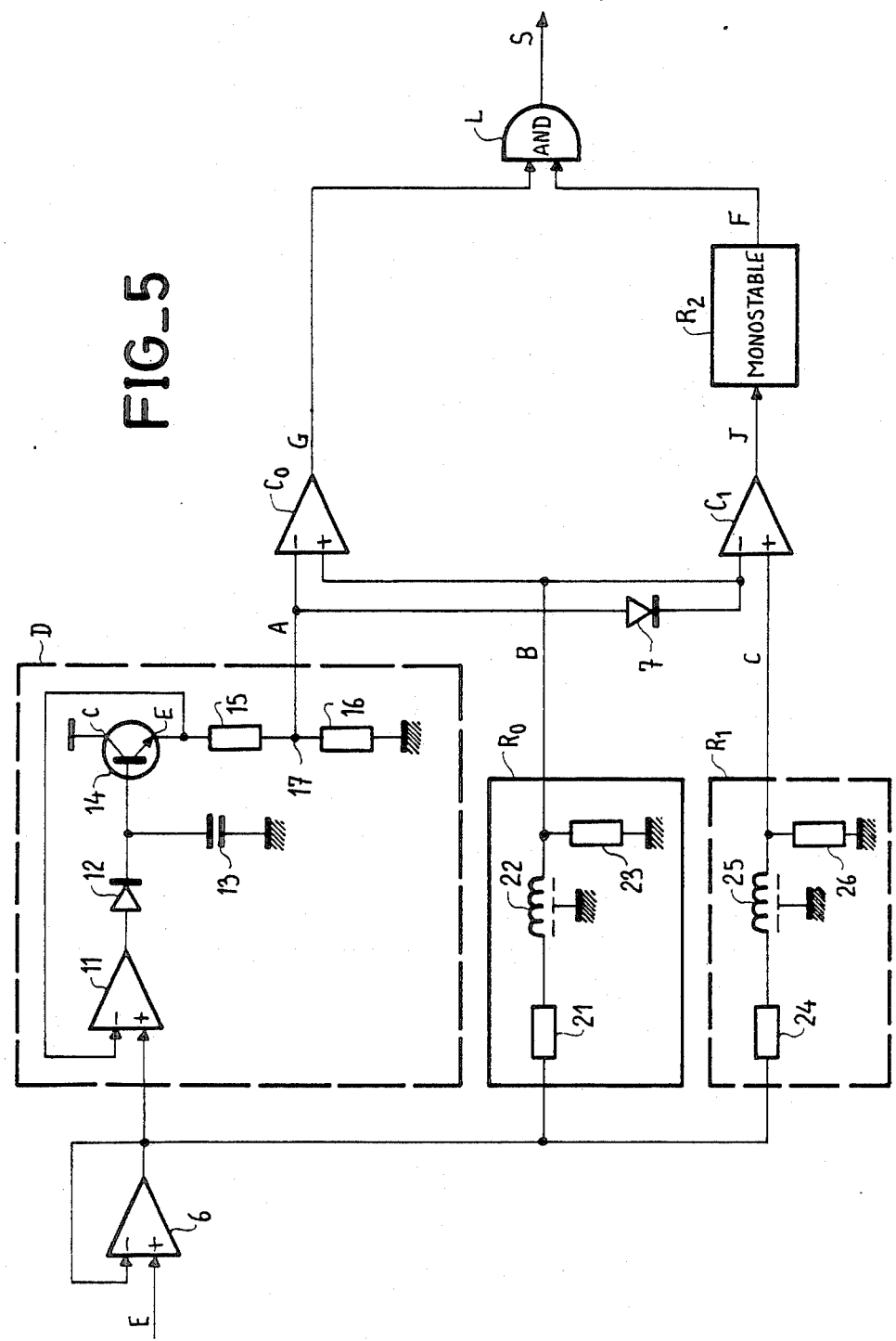
FIG_5

DEVICE FOR DETECTING A PULSE TRAIN IN NOISE AND APPLICATION TO A RADIONAVIGATION AID SYSTEM OF DME TYPE

BACKGROUND OF THE INVENTION

1. Field of the Invention

The present invention relates to a device for detecting each of the pulses of a pulse train among noise.

In some applications, such as radio-navigation aid systems of the DME (Distance Measuring Equipment) type, it is necessary to detect pulse trains, the train possibly comprising only two pulses as in the case of DME and, more precisely, to identify the pulses so as to detect the spacing thereof, which constitutes data.

2. Description of the Prior Art

Different devices are known for this purpose, particularly within DMEs where such detection is particularly critical. It will be recalled that in a DME the pulses are transmitted in pairs and at reception the spacing thereof is determined, the arrival time of each pulse being determined on its rising front, at mid height.

A known device for achieving such detection is shown in FIG. 1. In this FIG., a pulse pair E forming the input signal, is applied on the one hand to a peak detector D which defines the half height of the pulse, that is to say $V_c/2$ where $V_c$ is the peak value, and on the other hand to a delay line $R_o$. The signal coming from elements D and $R_o$, designated respectively $V_c/2$ and $E_R$, are applied to a comparator $C_o$. The purpose of the delay line $R_o$ is to delay the input pulses E by a time $\tau_o$ so that they arrive at the comparator $C_o$ at the same time as (or after) the detected value $V_c/2$.

The input signal E is shown in FIG. 2a as a function of time. The two pulses have substantially the same peak value $V_c$ and their spacing T is reckoned as the time interval separating the rising front of each of the pulses, at mid height ($V_c/2$). FIG. 2b shows, still as a function of time, the signal $E_R$ which is identical to the signal E but delayed with respect thereto by a time $\tau_o$. When the first delayed pulse ($E_R$) arrives at comparator C, this latter compares its rising front with $V_c/2$ and delivers a signal (rectangular pulse) at the time when this front reaches the value $V_c/2$. The signal delivered by comparator C, designated S, is shown as a function of time in FIG. 2c and the part of the signal S corresponding to the first pulse of the signal $E_R$ is referenced 1. When the second pulse forming the delayed signal $E_R$ reaches comparator C in its turn, this latter operates in the same way and delivers a second rectangular pulse referenced 2 in FIG. 2c. Between the rising fronts of pulses 1 and 2 of the output signals S we find the spacing T which separated the two input pulses E.

It is apparent that the operation of such a device requires the amplitude of the input signal E between two pulses to drop below the value $V_c/2$. In the opposite case, the comparator C is unable to identify the second pulse. However, this condition concerning the amplitude of the signal E may not be fulfilled when noise is superimposed on the pulse train. For example, when a DME is operating in an environment containing obstacles reflecting the radioelectric waves, these obstacles reflect with a certain delay DME pulses which are then superimposed on the direct propagation signals and form a composite input signal, whose amplitude may be greater than $V_c/2$ between the two pulses. Thus, the efficiency and accuracy of the whole of the DME is decreased : the number of valid measurements is reduced and in some cases is zero.

SUMMARY OF THE INVENTION

It is an object of the present invention to provide a detection device which overcomes this disadvantage because it does not require a decrease of amplitude, between two pulses, below the value $V_c/2$. In accordance with the invention, the first pulse is detected as before but the second pulse (as well as the following pulses of the train if any) is detected by self crossing, that is to say the crossing of the signal with itself is detected, suitably delayed.

More precisely, the device of the invention comprises:

means for detecting the peak $V_c$ of the first pulse of the train received;

first analog means conferring a first delay on the train received;

a comparator comparing the level of the first delayed pulse received with the level $V_c/2$;

second analog means conferring a second delay on the train received, different from the first delay;

a second comparator, comparing the signal delivered by the second delay line with the signal delivered by the first delay line and with the value $V_c/2$;

a logic circuit (of AND type) delivering an output signal when there is coincidence of the output signals from the two comparators.

BRIEF DESCRIPTION OF THE DRAWINGS

Other objects, features and results of the invention will be clear from the following description given by way of non limitative example and illustrated by the accompanying drawings which show:

FIG. 1, already described, a detection device of the prior art;

FIGS. 2a, 2b, and 2c already described, diagrams relative to the preceding Figure;

FIG. 3, a diagram of one embodiment of the detection device of the invention;

FIGS. 4a to 4e, diagrams relative to the preceding Figure;

FIG. 5, one practical embodiment of the device of the invention.

In these different Figures, the same references refer to the same elements.

DESCRIPTION OF THE PREFERRED EMBODIMENT

FIG. 3 is then a block diagram of one embodiment of the device of the invention. It will be described with reference to diagrams 4a to 4e, which show the variation in time of signals taken at different points of the device of FIG. 3.

The detection device receives then an input signal E which is applied in parallel to a peak detector D, to a first analog delay circuit $R_o$ and to a second analog delay circuit $R_1$.

In order to simplify the description, signal E is assumed formed of two pulses only, whose spacing T is predefined. However, to better illustrate the operation of the device of the invention, signal E shown with a broken line in FIG. 4a, is assumed very disturbed and sufficiently so for its value between these two pulses to be greater than its half peak value $V_c/2$.

In diagram 4a are also shown:

The signal A from the peak detector D which is a constant signal equal to $V_c/2$ after a certain rise time.

The signal B from the delay circuit $R_o$, which is then of the shape as the input signal E but delayed by a time $\tau_o$. It is shown with a continuous line.

The signal C from the delay circuit $R_1$, which is also identical to the signal E but delayed by a time $\tau_1$, different from $\tau_o$, with $\tau_1 < \tau_o$ in the particular case of an application to a DME.

Signals A and B are, as in the known device described in FIG. 1, applied to a first comparator $C_o$ whose output signal G is shown in the diagram B of FIG. 4. This comparator $C_o$ enables the moment to be detected when the delayed signal B becomes equal to $V_c/2$ (signal A). This moment is referenced $t_3$. Signal G is therefore at a constant level from the time $\tau_3$, until signal B again becomes less than $V_C/2$, which is not illustrated in FIGS. 4.

According to the invention, the device comprises a second comparator, referenced $C_1$, which receives the signal C (input signal delayed by $\tau_1$) to be compared both with signal B and with signal A ($V_C/2$). The signal delivered by comparator $C_1$ is referenced J and it is shown in FIG. 4c. It is set to up level at a time $t_1$, when the delayed signal C becomes equal to $V_c/2$. It remains at the up level until the amplitude of signal C decreases, which allows it to cross the signal B which, it will be remembered, is the same signal but delayed to $\tau_o$. This crossing is achieved at a time $t_4$. If the delayed signal C does not again drop below $V_c/2$, that is to say that if it does not cross signal A again, signal J rises to up level at the time referenced $t_5$ when the amplitude of the delayed signal C again increases, when the delayed signals B and C cross each other. It remains at this level until a time referenced $t_7$ when, with the amplitude of a delay signal C again decreasing, it again crosses the signal B. If the amplitude of signal C drops again below the value $V_c/2$ (signal A), it is the crossings with signal A which initiate the falling then rising fronts of signal J.

Thus, at the output of comparator $C_1$, a signal J is obtained having two rectangular pulses, referenced 3 and 4, whose spacing taken on the rising front corresponds substantially to the desired spacing T. In fact, the rising front of the first rectangular pulse (3) is obtained by detecting the half peak value of the signal (delayed signal C), then the successive falling and rising fronts are obtained by self crossing of the signal by itself (in practice, delayed signals B and C). Thus, only the change of sign of the slope of signal E (rising/falling) is required for producing the fronts of signal J at $t_4$, $t_5$ and $t_7$, without any condition concerning the amplitude of signal E after its peak value.

However, in a DME more particularly, the time when the delayed signal B crosses the half peak value $V_c/2$ is a time reference used in another connection. The system then comprises, at its output, logic coincidence means L, of the AND gate type for example, whose purpose is to align the rising front of pulse 3 (signal J) with time $t_3$ as shown in FIG. 4e. FIG. 4e represents the output signal S of the device.

However, in order to achieve the above described self crossing, a delay $\tau_1$ less than $\tau_o$ is conferred to signal C, which results in the starting time ($t_1$) of the duration T being in advance of the time $t_3$. In the embodiment shown in FIGS. 3 and 4, for compensating this shift, a delay circuit $R_2$ is added to the output of comparator $C_1$. The signal J then is delayed by a time $\tau_2$ to become the signal F shown in FIG. 4d, with $\tau_2 < \tau_o - \tau_1$, but close to this value. Thus, signal F is identical to signal J except that its rising fronts are delayed by $\tau_2$ and occur respectively at times $t_2$ and $t_6$. The delay $\tau_2$ is chosen so as to compensate as much as possible for the advance of time $t_1$ with respect to time $t_3$. Thus for the output signal S two rectangular pulses are obtained whose rising fronts occur respectively at times $t_3$, given by the signal G (time reference of the DME) and $t_6$, given by the signal F, with $t_6 - t_3 \simeq T$, T being the desired spacing between the pulses. Between these times, signal S follows the evolution of signal F, itself obtained from the delayed signal J.

FIG. 5 shows a practical embodiment of the detection device of the invention.

In this Figure, signal E is applied to an operational amplifier 6, relooped on itself, whose function is to decouple the operation of the device of the invention from the preceding circuit chain.

The signal E is therefore applied at the output of amplifier 6, in parallel to the peak detector D and to the delay circuits $R_o$ and $R_1$ whose construction is described hereafter. The output signals, respectively A, B, C of these three blocks D, $R_o$ and $R_1$ are applied to the comparators $C_o$ and $C_1$, each formed by a differential amplifier. A connection is formed between the output of detector D and the input ($-$) of comparator $C_1$, so as to ensure that the comparator $C_1$ is triggered on $V_c/2$ (signal A, time $t_1$). A diode 7 is placed in this connection, with the anode on the detector side and the cathode on the comparator side, so as to prevent signal B from disturbing the value $V_c/2$ (A). The output signal J from comparator $C_1$ is delayed by a time $\tau_2$ by the circuit $R_2$, which may be formed by a monostable. A monostable is a logic circuit with which a delay may be adjusted more accurately than with an analog delay line. It should be noted that the duration of the rectangular pulses forming signal F depends on the monostable used. It is immaterial here, as long as it is sufficient to cover time $t_3$, that is to say at least a little longer than $(t_3 - t_1) - \tau_2$. The output signals G and F of circuits $C_o$ and $R_2$ are applied to the AND gate L for supplying the output signal S.

The peak detector assembly D is formed by a differential amplifier 11 receiving the signal E at its positive input and whose output is connected to the anode of a diode 12. The cathode of diode 12 is connected to the base of transistor 4, for example of NPN type, whose collector is connected to a power supply and whose emitter is connected to ground through two resistors 15 and 16. The emitter of transistor 14 is also connected to the negative input of amplifier 11. The base of this same transistor 14 to ground through a capacitor 13. Thus it is apparent that the signal obtained at the emitter of transistor 14 increases with the input signal E up to the peak value $V_c$. At that time, because the emitter of transistor 14 is relooped through the negative input of amplifier 11, diode 12 and capacitor 13, the level of the signal at the emitter does not drop when the input signal decreases. Thus the value $V_c$ is permanently present at the emitter of transistor 14. The resistors 15 and 16 are used for dividing the peak voltage by 4, the voltage $V_c/4$ being obtained at the middle point, referenced 17, of these resistors. It is desirable to obtain at point 17 a voltage equal to $V_c/4$ and not to $V_c/2$, as shown in FIG. 3, so as to take into account the fact that, at the output of the delay circuits $R_o$ and $R_1$, it is not the input signal which is obtained but a signal whose amplitude is divided by two, as explained hereinafter.

The delay circuit $R_o$ comprises in this emodiment an analog delay line, referenced 22, of the LC type for example with distributed constants. The input of line 22 receives the input signal through a resistor 21 whose value is equal to the characteristic impedance of line 22. Similarly, the output of line 22 is connected to ground through a resistor 23 also equal to the characteristic impedance of the line. Thus it is clear that the signal B obtained at the output of line 22 has its amplitude divided by two with respect to that of the input signal.

The delay circuit $R_1$ is formed similarly by an analog delay line 25, for example of the same type as line 22, whose ends are connected respectively to the input signal E through a resistor 24 and to ground through a resistor 26, each of the resistors being equal to the characteristic impedance of the line. Signal C, whose amplitude is similarly divided by two with respect to the amplitude of signal E, is taken off at the output of the delay line 25.

What is claimed is:

1. A device for detecting a pulse train, said train comprising a plurality of pulses, said device comprising:
    means for detecting the peak value of the first pulse of said train;
    first analog delay means receiving said pulse train and conferring thereon a first delay for forming a first output signal;
    a first comparator for comparing the level of said first output signal with the half of said peak value and delivering a first signal when said first output signal becomes equal to said half peak value and as long as said first output signal remains greater than said half peak value;
    second analog delay means receiving said pulse train, conferring thereon a second delay, different from said first delay for forming a second output signal;
    a second comparator comparing the level of said second output signal with said half peak value and with said first output signal and delivering a second signal when said second output signal becomes equal either to said half value or to said first output signal, and delivering said second signal from the second comparator as long as said second output signal remains greater than the greatest of said half value and said first output signal;
    logic means receiving said first and second signals from said first and second comparators respectively and delivering a signal when there is coincidence between said first and second signals.

2. The device as claimed in claim 1, wherein said second delay is smaller than said first delay.

3. The device as claimed in claim 2, further comprising third delay means conferring a third delay on said second signal from said second comparator, said third delay being less than the difference between said first and second delays, but close to this difference, said third delay means being positioned between said second comparator and said logic means.

4. The device as claimed in claim 1, wherein said logic means comprise an AND gate.

5. The device as claimed in claim 3, wherein said third delay means comprise a monostable.

6. The device as claimed in claim 1, wherein said detection means comprise:
    a differential amplifier having two inputs, receiving the pulse train at its first input (+);
    a diode connected by its anode to the output of said amplifier;
    a capacitor connected between the cathode of said diode and ground;
    a transistor whose base is connected to said cathode, collector to an electric power supply and emitter to the second input of said amplifier, the peak value of said pulse train being available at said emitter.

7. The device as claimed in claim 1, wherein said first delay means comprise a delay line of the LC type at the ends of which are connected respectively two resistors each having an impedance equal to the characteristic impedance of said line.

8. The device as claimed in claim 1, wherein said second delay means comprise a delay line of the LC type at the ends of which are connected respectively two resistors each having an impedance equal to the characteristic impedance of said line.

9. The device as claimed in claim 1, further comprising decoupling means receiving said pulse train and transmitting it to said detection means and to said first and second delay means.

* * * * *